US007479689B2

(12) United States Patent
Kim et al.

(10) Patent No.: US 7,479,689 B2

(45) Date of Patent: Jan. 20, 2009

(54) ELECTRONICALLY PROGRAMMABLE FUSE HAVING ANODE AND LINK SURROUNDED BY LOW DIELECTRIC CONSTANT MATERIAL

(75) Inventors: Deok-Kee Kim, Bedford Hills, NY (US); Xiangdong Chen, Poughquag, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 11/627,384

(22) Filed: Jan. 26, 2007

(65) Prior Publication Data

US 2008/0179706 A1 Jul. 31, 2008

(51) Int. Cl.
*H01L 23/58* (2006.01)

(52) U.S. Cl. .............................. 257/529; 257/E23.149

(58) Field of Classification Search ................ 257/499, 257/528, 529, 530, 49, 50, 202, 208, 209, 257/E23.149

See application file for complete search history.

(56) References Cited

U.S. PATENT DOCUMENTS

| | | | | |
|---|---|---|---|---|
| 6,259,146 | B1 | 7/2001 | Giust et al. | |
| 2002/0011645 | A1* | 1/2002 | Bertin et al. | 257/529 |
| 2002/0142592 | A1* | 10/2002 | Barth et al. | 438/687 |
| 2005/0224910 | A1 | 10/2005 | Kuno et al. | |
| 2005/0269666 | A1* | 12/2005 | Chung et al. | 257/528 |
| 2005/0285224 | A1* | 12/2005 | Tsutsui | 257/531 |
| 2006/0043595 | A1 | 3/2006 | Aratani et al. | |
| 2006/0102982 | A1 | 5/2006 | Park et al. | |
| 2006/0108662 | A1 | 5/2006 | Kothandaraman et al. | |

* cited by examiner

*Primary Examiner*—Evan Pert
*Assistant Examiner*—Kevin Quinto
(74) *Attorney, Agent, or Firm*—Lisa Jaklitsch; Hoffman Warnick LLC

(57) ABSTRACT

An electronically programmable fuse (e-fuse) is disclosed. In one embodiment, the e-fuse includes a cathode surrounded only by silicon dioxide; an anode; and a polysilicon-silicide programmable link coupling the anode and the cathode, wherein the anode and the polysilicon-silicide programmable link are surrounded by a low dielectric constant (low-k) material on a top and a side thereof.

9 Claims, 3 Drawing Sheets

ELECTRONICALLY PROGRAMMABLE FUSE HAVING ANODE AND LINK SURROUNDED BY LOW DIELECTRIC CONSTANT MATERIAL

BACKGROUND

1. Technical Field

The disclosure relates generally to integrated circuit (IC) chip fabrication, and more particularly, to an electronically programmable fuse having an anode and link surrounded by a low dielectric constant material.

2. Background Art

Fuse devices are used in numerous integrated circuit (IC) chip applications. For example, fuse devices may be included in redundancy implementation in memory arrays, field programmable arrays, voltage trimming resistors/capacitors, radio frequency (RF) circuit tuning, electronic chip identification, usage tracking/diagnostic data log, remote disablement for a device/car that is reported stolen, read only memory (ROM), etc. Fuse devices are realized using many different technologies and materials in the IC chip fabrication industry. In U.S. Pat. No. 2005/0285224A1, electromigration or agglomeration of silicide is used for an electronically programmable fuse (efuse). U.S. Pat No. 2006/0108662 A1 discloses a single crystal fuse on a semiconductor on insulator (SOI) substrate in which electromigration is used to program the fuse. As in U.S. Pat. No. 2006/0043595A1, phase change materials such as germanium-antimony-tellerium (GST) ($Ge_2Sb_2Te_5$ or GeSbSi) can be used in a fuse device as well as in non-volatile memory. Anti-fuse devices using gate dioxide breakdown in a typical gate structure are used as well, e.g., as in U.S. Pat. No. 2006/0102982A1.

One challenge relative to these devices is performing efficient programming. That is, controlling electromigration by application of a voltage to cause activation of the fuses. For example, in the case of the non-volatile memory using phase change materials, a new material and/or processing steps compared to the standard complementary metal dioxide semiconductor (CMOS) processing is required for further development to occur. In the case of anti-fuse device using gate dioxide breakdown in a typical gate structure, a high voltage is typically required. However, the high voltage is problematic to other devices.

SUMMARY

An electronically programmable fuse (e-fuse) is disclosed. In one embodiment, the e-fuse includes a cathode surrounded only by silicon dioxide; an anode; and a polysilicon-silicide programmable link coupling the anode and the cathode, wherein the anode and the polysilicon-silicide programmable link are surrounded by a low dielectric constant (low-k) material on a top and a side thereof.

A first aspect of the disclosure provides an electronically programmable fuse comprising: a cathode surrounded only by silicon dioxide; an anode; and a polysilicon-silicide programmable link coupling the anode and the cathode, wherein the anode and the polysilicon-silicide programmable link are surrounded by a low dielectric constant (low-k) material on a top and a side thereof.

A second aspect of the disclosure provides an electronically programmable fuse (e-fuse) comprising: a cathode surrounded only by silicon dioxide; an anode; and a polysilicon-silicide programmable link coupling the anode and the cathode, wherein the anode and the polysilicon-silicide programmable link are surrounded by hydrogenated silicon oxy-carbide (SiCOH) on a top and a side thereof.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
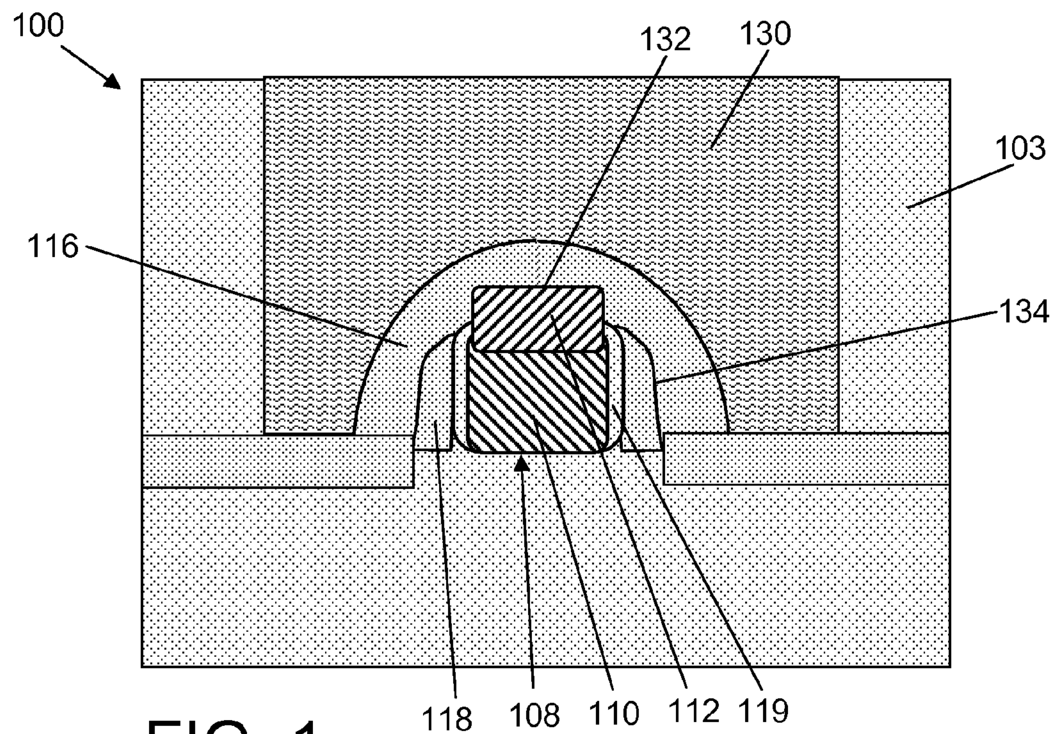
FIG. 1 shows a lateral cross-section view, through a polysilicon-silicide programmable link, of one embodiment of an electronically programmable fuse (e-fuse).

Turning to FIGS. 1-5, various embodiments of an electronically programmable fuse (e-fuse) 100 are disclosed. Each e-fuse 100 is formed over an isolation region 102, e.g., of silicon dioxide ($SiO_2$), and an interlevel dielectric 103, e.g., also of silicon dioxide, is formed thereover. Each fuse 100 includes a cathode 104, an anode 106 and a polysilicon-silicide programmable link 108 coupling cathode 104 to anode 106. Although not shown for brevity, it is understood that cathode 104 and anode 106 are thicker laterally into-and-out-of the page compared to polysilicon-silicide programmable link 108, i.e., cathode 104 and anode 106 are wider than polysilicon-silicide programmable link 108 as the link is shown in FIG. 1. The position of cathode 104 and anode 106 may be switched. Polysilicon-silicide programmable link 108 includes a polysilicon portion 110 and a silicide portion 112, the latter of which initially makes polysilicon-silicide programmable link 108 conductive. Silicide portion 112 may include any metal such as titanium, nickel, cobalt, nickel-platinum, tungsten, tantalum, ytterbium, erbium, molybdenum, etc., and may be formed using any now known or later developed technique, e.g., depositing metal, annealing to have the metal react with silicon, and removing un-reacted metal. A silicon nitride barrier layer 114 (e.g., $Si_3N_4$ or N-blok) may cover all of e-fuse 100. Each e-fuse 100 is formed having a silicon nitride barrier layer 116 thereover. Polysilicon portion 110 and silicide portion 112 may have a silicon dioxide spacer 118 and silicon nitride spacer 119 (FIG. 1 only) adjacent thereto.

As understood, polysilicon-silicide programmable link 108 is 'programmable' by application of a voltage to contacts 120 by way of, for example, wires 122 of a first metal layer formed in interlevel dielectric 103. As the voltage is applied, it heats polysilicon-silicide programmable link 108 and causes the metal of silicide portion 112 to migrate into polysilicon portion 110, thus causing polysilicon-silicide programmable link 108 to become non-conductive, opening e-fuse 100.

According to embodiments shown in FIGS. 1-5, anode 106 and polysilicon-silicide programmable link 108 are surrounded by a low dielectric constant (low-k) material 130 on a top 132 (FIG. 1 only) and a side 134 (FIG. 1 only) thereof, i.e., not underneath. Cathode 104 is surrounded only by silicon dioxide. In one embodiment, the low-k material includes hydrogenated silicon oxycarbide (SiCOH), porous SiCOH, porous methyl silsesquioxane (MSQ), porous hydrogen silsesquioxane (HSQ), octamethylcyclotetrasiloxane (OMCTS) $(CH_3)_2SiO—)_4$ 2.7 available from Air Liquide, etc. or other low-k dielectrics. However, any low-k material having a thermal conductivity lower than silicon dioxide (approximately 1.3 W/cm K for $SiO_2$ compared to approximately 0.21 W/cm K for SiCOH or other low-k material}) may be used. "Low-k" as used herein means any material having a dielectric constant less than approximately 3.9. In this fashion, enhanced programming with improved thermal insulation can be achieved. In particular, electromigration is dependent on the diffusion of metal from silicide portion 112 of polysilicon-silicide programmable link 108 into anode 106, which is dependent on temperature. SiCOH has a poor thermal conductivity and provides a good thermal insulation. As a result, SiCOH heats up faster during programming, and thus requires less power and enhances electromigration during programming. Most of anode 106 is maintained relatively hot by low-k material 130, which maximizes flux divergence due to current crowding and enhances the temperature gradient. In contrast, most of cathode 104 is maintained relatively cool by silicon dioxide 102, 103 in order to limit the supply of metal from silicide portion 112 during electromigration. Enhanced programming requires less programming current, and hence, a smaller programming transistor (not shown), which results in less IC chip area. Also, the mechanically weaker SiCOH will exert less mechanical back-stress compared to silicon dioxide, which will enhance electromigration.

Figure 2:
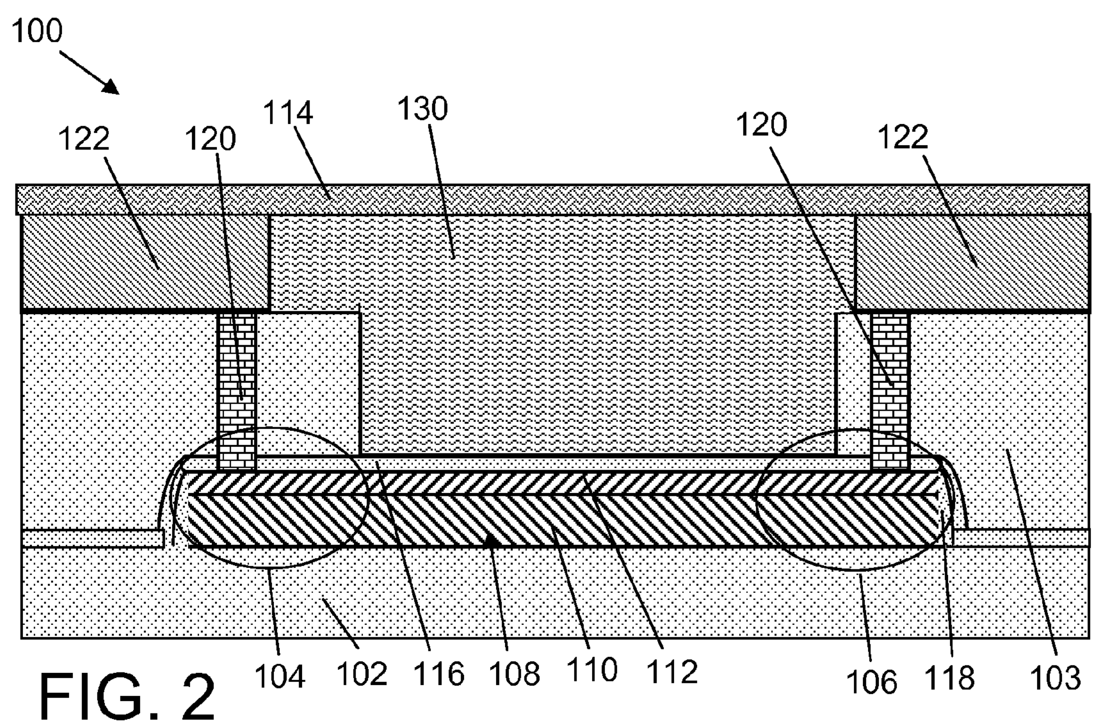
FIG. 2 shows a longitudinal cross-section view of the embodiment of FIG. 1.
Figure 3:
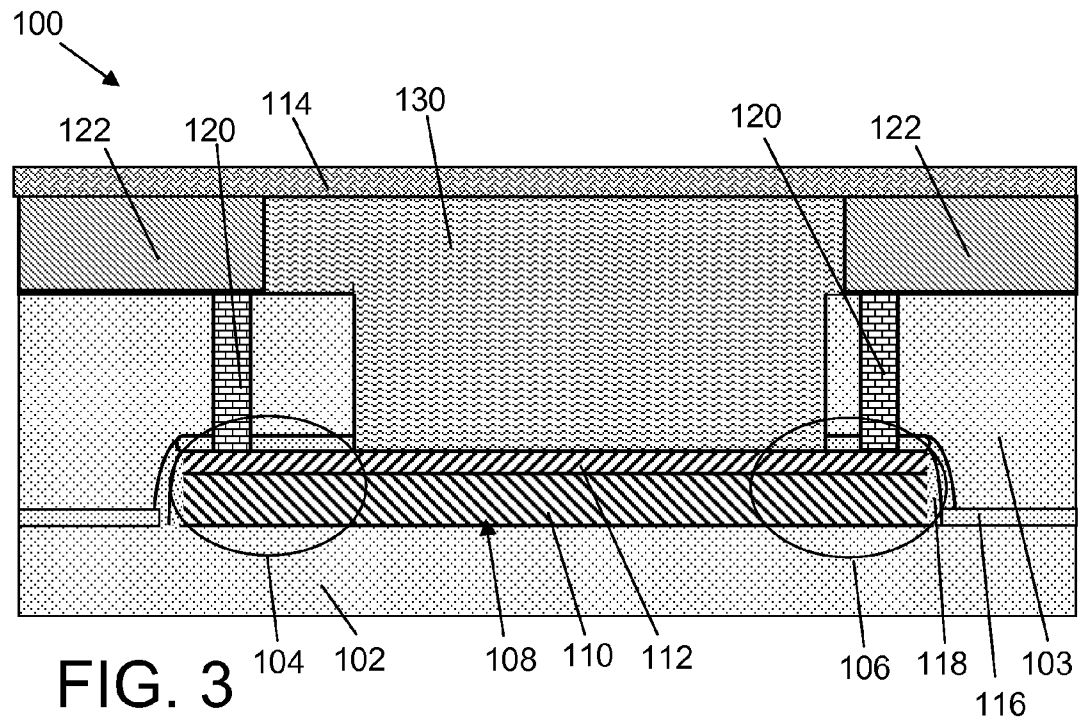
FIG. 3 shows a lateral cross-section view of another embodiment of an e-fuse.
Figure 4:
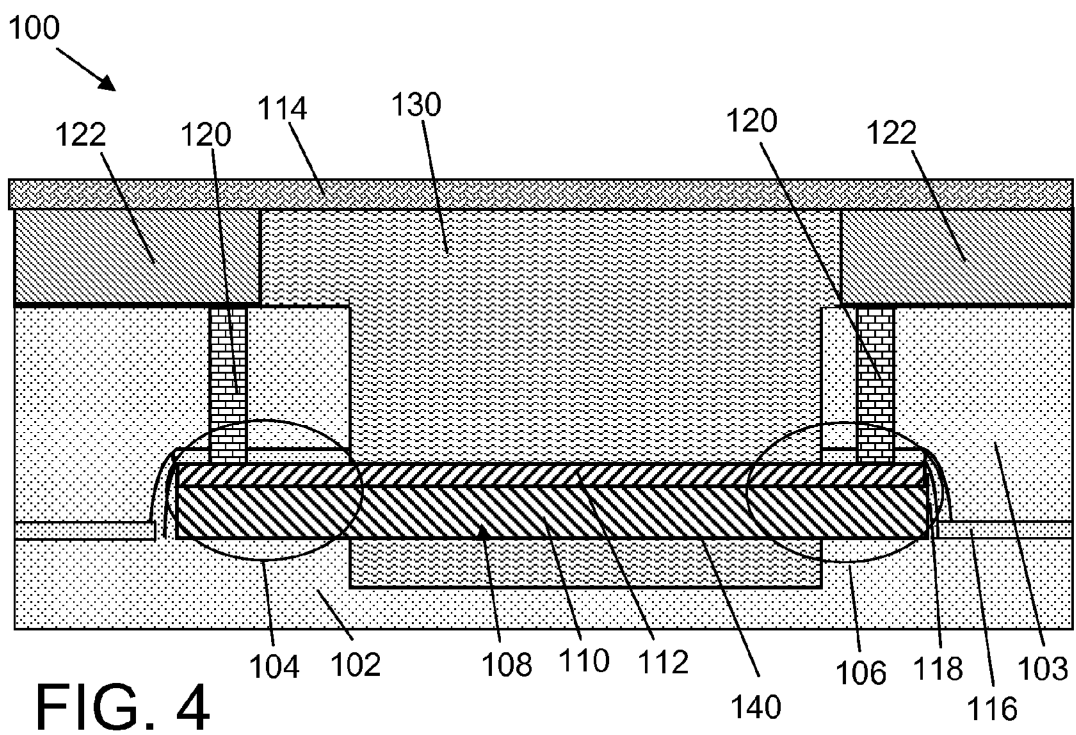
FIG. 4 shows a lateral cross-section view of another embodiment of an e-fuse.
Figure 5:
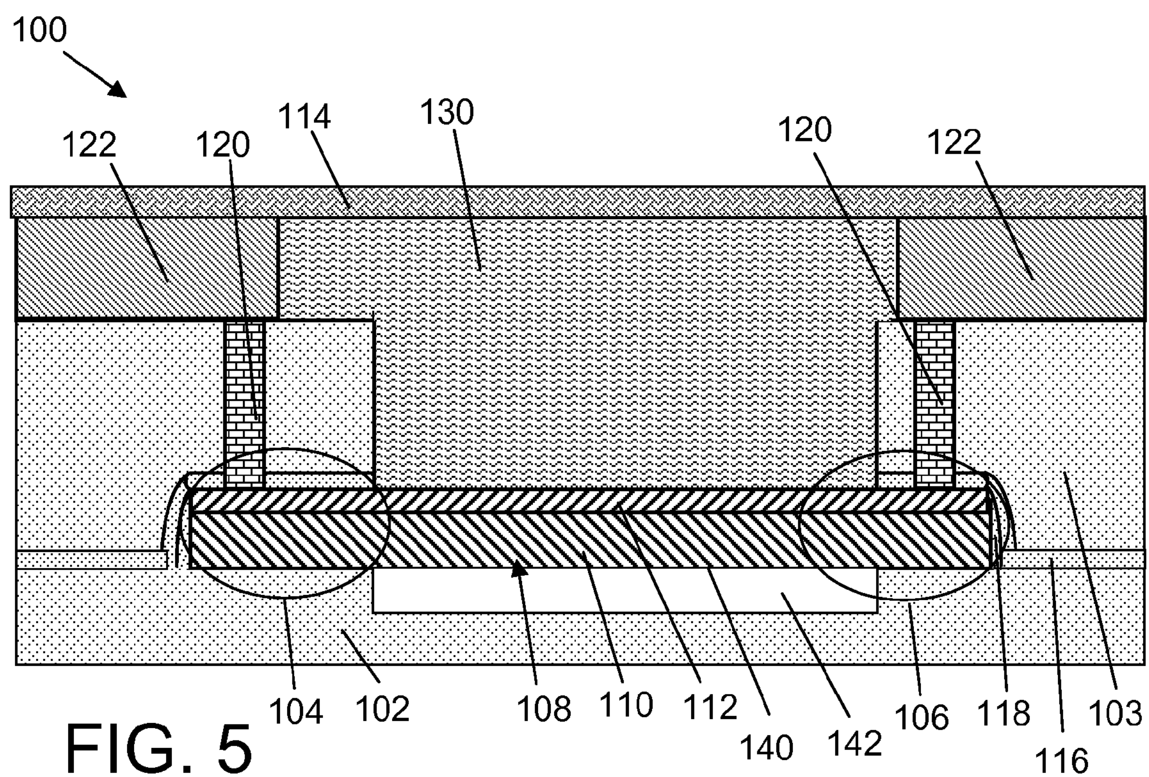
FIG. 5 shows a lateral cross-section view of yet another embodiment of an e-fuse.

FIGS. 1-2 show e-fuse 100 with silicon nitride barrier layer 116 intact over anode 106 and polysilicon-silicide programmable link 108. Hence, silicon nitride barrier layer 116 is between anode 106 and polysilicon-silicide programmable link 108 and low-k material 130. In one embodiment, shown in FIG. 3, silicon nitride barrier layer 116 may be removed over anode 106 and polysilicon-silicide programmable link 108, thus allowing contact thereto. This latter embodiment may allow for further enhanced programmability. FIG. 4 shows another embodiment in which low-k material 130 also surrounds a bottom 140 of anode 106 and polysilicon-silicide programmable link 108, which may further enhance programmability. FIG. 5 shows another embodiment in which low-k material 130 is not allowed to surround bottom 140 of anode 106 and polysilicon-silicide programmable link 108. As a result, a void dielectric 142 (e.g., a vacuum or gas dielectric) is formed below anode 106 and polysilicon-silicide programmable link 108, thus improving the insulative nature of silicon dioxide 102.

The above-described embodiments may be formed using any now known or later developed methods. For example, polysilicon portion 110 and silicide portion 112 may be formed during typical poly-conductor processing, i.e., by deposition of polysilicon portion 110, silicidation and patterning, and spacer formation, after active area (not shown) and isolation region 102 formation. Dielectric material 130 may be formed by forming an opening in interlevel dielectric 103 over anode 106 and polysilicon-silicide programmable link 108 (e.g., by depositing a mask, patterning mask and etching opening) and filling the opening with low-k material 130, e.g., by spin-on coating (FIGS. 1-4) or chemical vapor deposition (CVD)(FIG. 5). Any etching processing necessary may be employed, e.g., wet etching and/or reactive ion etching (RIE). Where contact to anode 106 and polysilicon-silicide link 108 is desired formation of the opening may further include etching silicon nitride layer 116 off of anode 106 and polysilicon-silicide programmable link 108. Where contact to bottom 140 is desired, further etching (wet etching or RIE) may be carried out to form the opening under anode 106 and polysilicon-silicide programmable link 108. Appropriate chemical mechanical polishing (CMP) may be carried out as necessary. Contacts 120 and wires 122 may be formed using standard processing, e.g., damascene processing. Appropriate formation of low-k material 130 ensures contact with bottom 140, or, in the case that void dielectric 142 is desired that low-k material 130 does not completely fill under anode 106 and polysilicon-silicide programmable link 108. In any event, the formation of e-fuse 100 is compatible with standard CMOS processing.

The e-fuses 100 described above are used in the fabrication and/or operation of integrated circuit (IC) chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. An electronically programmable fuse (e-fuse) comprising:

a cathode surrounded only by silicon dioxide;

an anode;

a polysilicon-silicide programmable link coupling the anode and the cathode, wherein the anode and the polysilicon-silicide programmable link are surrounded by a low dielectric constant (low-k) material on a top, a bottom and a side thereof; and a silicon nitride barrier layer between the anode and the polysilicon-silicide programmable link and the low-k material.

2. The e-fuse of claim 1, further comprising a void dielectric below the anode and the polysilicon-silicide programmable link.

3. The e-fuse of claim 1, wherein the e-fuse is positioned over an isolation region.

4. The e-fuse of claim 1, wherein the low-k material includes hydrogenated silicon oxycarbide (SiCOH).

5. The e-fuse of claim 1, wherein the low-k material has a thermal conductivity lower than the silicon dioxide.

6. The e-fuse of claim 1, wherein the anode and the polysilicon-silicide programmable link are contacted by the low-k material.

7. An electronically programmable fuse (e-fuse) comprising:

a cathode surrounded only by silicon dioxide;

an anode;

a polysilicon-silicide programmable link coupling the anode and the cathode, wherein the anode and the polysilicon-silicide programmable link are surrounded by hydrogenated silicon oxycarbide (SiCOH) on a top, a bottom and a side thereof; and a silicon nitride barrier layer between the anode and the polysilicon-silicide programmable link and the SiCOH.

8. The e-fuse of claim 7, further comprising a void dielectric below the anode and the polysilicon-silicide programmable link.

9. The e-fuse of claim 7, wherein the anode and the polysilicon-silicide programmable link are contacted by the SiCOH.

* * * * *